United States Patent
Theobold et al.

(10) Patent No.: US 7,457,594 B2
(45) Date of Patent: Nov. 25, 2008

(54) ISOLATED SENSOR FOR AN ANTENNA

(75) Inventors: David Theobold, Akron, OH (US);
James Amos, North Canton, OH (US);
Edward Wright, Midlefield, OH (US)

(73) Assignee: Cisco Technology, Inc.

( * ) Notice: Subject to any disclaimer, the term of this patent is extended or adjusted under 35 U.S.C. 154(b) by 668 days.

(21) Appl. No.: 11/050,518

(22) Filed: Feb. 3, 2005

(65) Prior Publication Data
US 2006/0014503 A1    Jan. 19, 2006

Related U.S. Application Data

(63) Continuation-in-part of application No. 10/894,245, filed on Jul. 19, 2004.

(51) Int. Cl.
*H04B 17/00* (2006.01)
*H01Q 11/12* (2006.01)

(52) U.S. Cl. ............... 455/115.1; 455/126; 455/127.1; 455/67.11

(58) Field of Classification Search ............... 455/126, 455/127.1, 522, 115.1, 115.3; 398/33, 38, 398/197
See application file for complete search history.

(56) References Cited

U.S. PATENT DOCUMENTS

| | | | |
|---|---|---|---|
| 6,321,072 B1 * | 11/2001 | Cipriani et al. | 455/126 |
| 6,480,702 B1 * | 11/2002 | Sabat, Jr. | 455/115.3 |
| 6,690,922 B1 * | 2/2004 | Lindemann | 455/69 |
| 6,704,579 B2 * | 3/2004 | Woodhead et al. | 455/522 |
| 6,751,448 B1 * | 6/2004 | Frydman et al. | 455/126 |
| 6,879,918 B2 * | 4/2005 | Daoud et al. | 702/65 |
| 7,088,971 B2 * | 8/2006 | Burgener et al. | 455/127.1 |
| 7,171,238 B2 * | 1/2007 | Nicholson | 455/557 |
| 7,233,740 B2 * | 6/2007 | Therisod | 398/33 |
| 2003/0148762 A1 * | 8/2003 | Noe | 455/423 |
| 2004/0042428 A1 * | 3/2004 | Hamalainen et al. | 370/335 |
| 2005/0075090 A1 * | 4/2005 | Bickham et al. | 455/344 |
| 2006/0199552 A1 * | 9/2006 | Blech et al. | 455/127.1 |

* cited by examiner

*Primary Examiner*—Duc M Nguyen
(74) *Attorney, Agent, or Firm*—Tucker Ellis & West, LLP (57) ABSTRACT

A system for measuring output power from an antenna. A sensor receives a sample of wireless signals from the antenna and communicates data about the signal back to the transmitter in a manner such that the antenna pattern is undisturbed. An optical coupler, e.g., fiber optic, is used to send data from the sensor to the transmitter. Power for the sensor can be derived parasitically from the wireless signal or can be provided to the sensor optically.

22 Claims, 7 Drawing Sheets

ISOLATED SENSOR FOR AN ANTENNA

CROSS-REFERENCE TO RELATED APPLICATIONS

This application is a continuation-in-part of U.S. application Ser. No. 10/894,245 filed on Jul. 19, 2004. This application is related to U.S. application Ser. No. 10/757,134 filed Jan. 14, 2004.

BACKGROUND OF THE INVENTION

The present invention relates generally to transmitters and more specifically to a system and method for calibrating transmitter power.

Transmission standards typically limit the total radiated power from a transmitter/antenna system. In a typical transmitter/antenna system, the transmitter output power is controllable and the antenna has a known gain. Thus, to meet transmission standards, the antenna gain and transmitter power are set so that the power limit of the standard is not exceeded when the antenna is directly connected to the transmitter, a best case scenario as it is assumed there is no power loss between the transmitter and the antenna.

However, antennas that are remote from a transmitter may be connected by an arbitrary length of cable that has an unknown loss. Because of the power loss within the cable, the true system radiated power is reduced, resulting in a reduction in transmission system efficiency. Thus a technique is needed to measure the radiated power at the antenna so that cable loss can be calibrated out of the system by increasing the transmit power to make up for the loss.

BRIEF SUMMARY OF THE INVENTION

In accordance with an aspect of the present invention, power is measured remotely on an antenna and communicated back to the transmitter in a manner such that the antenna pattern is undisturbed.

In accordance with an aspect of the present invention, there is disclosed herein a transmission system. The transmission system has an adjustable transmit power source that is coupled to an antenna. The adjustable transmit power source sends a signal to the antenna that is wirelessly transmitted by the antenna. A sensor that is optically coupled to the adjustable transmit power source receives a sample of wireless signals from the antenna and optically sends data from the sensor to the adjustable transmit source.

In accordance with an aspect of the present invention, there is disclosed herein a system comprising means for transmitting a wireless signal by an antenna. The system further includes sensing means for wirelessly sensing the signal and means for optically sending data about the signal from the sensor to the means for transmitting.

In accordance with an aspect of the present invention, there is disclosed herein a method for monitoring an antenna with an isolated sensor. The method comprises sampling RF energy from the antenna and generating an optical signal based on the sampled RF energy from the antenna, and communicating the optical signal to a transmitter coupled to the antenna.

A feature of the present invention is that it measures power at the antenna but does not disturb the radiating properties of the antenna itself, (e.g., pattern function, VSWR, impedance). As an ancillary benefit, the present invention also verifies continuity in the conductivity of the antenna element itself.

Still other objects of the present invention will become readily apparent to those skilled in this art from the following description wherein there is shown and described a preferred embodiment of this invention, simply by way of illustration of one of the modes best suited for to carry out the invention. As it will be realized, the invention is capable of other different embodiments and its several details are capable of modifications in various obvious aspects all without departing from the invention. Accordingly, the drawing and descriptions will be regarded as illustrative in nature and not as restrictive.

BRIEF DESCRIPTION OF THE SEVERAL VIEWS OF THE DRAWING

The accompanying drawings incorporated in and forming a part of the specification illustrates several aspects of the present invention, and together with the description serve to explain the principles of the invention.

DETAILED DESCRIPTION OF INVENTION

Throughout this description, the preferred embodiment and examples shown should be considered as exemplars, rather than limitations, of the present invention.

Figure 1:
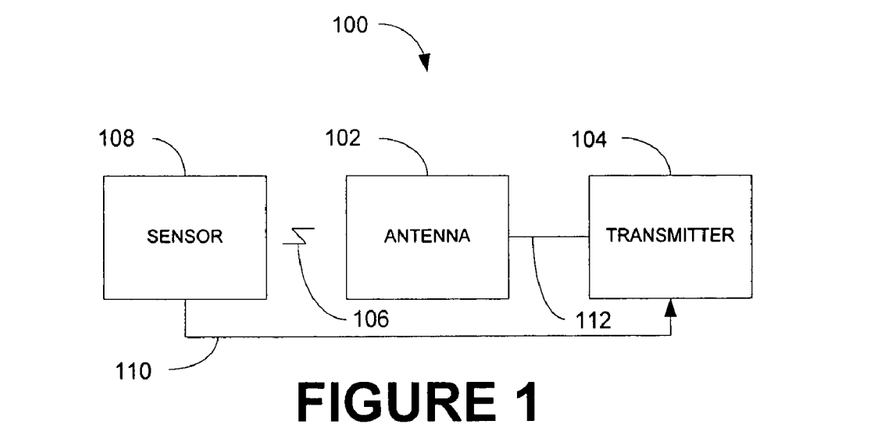
FIG. 1 is a block diagram of a system in accordance with an aspect of the present invention.

FIG. 1 is a block diagram of a system 100 in accordance with an aspect of the present invention. Transmitter 104 sends a signal to antenna 102 along conductor 112. Conductor 102 is suitably one of a cable, printed circuit board connection or as those skilled in the art can readily appreciate via any of numerous other alternative means. Antenna 102 then wirelessly transmits the signal as shown by 106. Transmitter 104 is suitably configured so that the power of the signal sent to antenna 102 can be adjusted. Sensor 108 receives a sample of wireless signal 106 and provides data about signal 106. For example, sensor 108 can determine whether a signal 106 has been sent by antenna 102, verify continuity of the antenna, or can measure the power of signal 106. The data obtained by sensor 108 is sent to transmitter 104 via an optical coupler 110. In at least one embodiment, optical is coupler 110 comprises a fiber optic cable.

This technique provides a remote measurement that does not disturb the RF properties of the antenna because the sensor is isolated via the optic coupler, such as a glass fiber. A conventional wired power detector would need to be decoupled adequately from the antenna so as to leave the field undisturbed, which is best done at the feed point of the antenna. The present invention allows sampling to be performed anywhere along the length of the antenna, thereby providing a measurement of at least one of antenna element continuity and power. It is also assumed that the design of the sensor is such that its size and constituent components have minimal effect upon the antenna transmission characteristics.

In at least one embodiment of the present invention, power sensor 108 makes output power measurements and can be located either at antenna 102 or upstream thereof. In accordance with one aspect of the present invention, power sensor 108 can be used to determined whether an antenna, or in the case of an array antenna whether an array element is conducting. In accordance with another aspect of the present invention, power sensor 108 can measure the power of the signal 106 radiating from antenna 102, and send measurement data to transmitter 104 via optic coupler 110, thereby enabling transmitter 104 to compensate for power loss along conductor 112, from transmitter 104 and/or antenna 102.

In at least one embodiment, sensor 108 does not require a separate power supply. Power can be derived parasitically from signal 106 as will be described herein. In a preferred embodiment, the very low duty cycle of the measurement (typically minutes or lower) permits the use of the parasitic mechanism. This is true for making the power measurement and/or the continuity measurement.

In other embodiments, sensor 108 receives power optically from transmitter 104. In one scenario, data from sensor 108 to transmitter 104 is sent on a first optical frequency along optic coupler 110 while the power is sent from transmitter 104 to sensor 108 using a second optical frequency along optical coupler 110. In another scenario, optical coupler 110 comprises two optical couplers, the first optical coupler for sending data from sensor 108 to transmitter 104 and the second optical coupler optically sending power from transmitter 104 to sensor 108. Because data and/or power is sent between transmitter 104 and sensor 108 optically, the RF characteristics of the transmission line are not disturbed, thus obviating the need for any additional wiring between sensor 108 and transmitter 104.

In at least one embodiment, it is contemplated that the present system 100 would communicate over one or both of the 2.4 GHz and 5 GHz wireless bands, in accordance with the IEEE 802.11 protocols. Of course, it should be appreciated that the present embodiments could be used with any wireless communication device, operating under any wireless band, including large communications stations and small, handheld units, all without departing from the scope of the invention.

Another aspect of the present invention is that it can facilitate FCC compliance. Sensor 108 provides accurate real time power measurements of signals 106 from antenna 102 to transmitter 104. Transmitter 104 can be part of an access point or bridge connected to a network (not shown). The measured antenna characteristics can be accessed and read by a network administrator at a remote location. This can assist in inventory control and technical support of a Wireless Local Area Network (WLAN), since all the antennas in a WLAN can be queried. In this way, compliance can be assured at the administrative level, and any failures or other operational variations can be detected. In a system upgrade, new access points can be added to a WLAN, e.g. for distributing sectorized coverage of a public space over a number of newly added wireless channels. In this event, it may be desirable to remotely reprogram the serialization component "on the fly" over the network, to select a new maximum output power and/or channel limitation. Sensor 108 insures the maximum output power and/or channel limitations are in compliance, thus allowing greater control and flexibility of network management.

Figure 2:
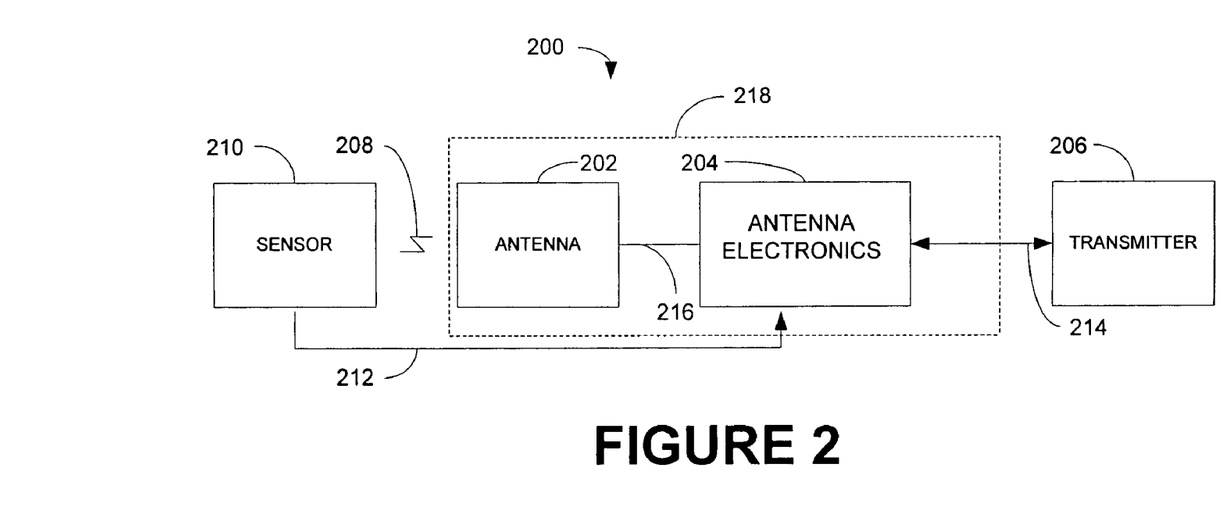
FIG. 2 is a block diagram of a system for an antenna system having associated electronics in accordance with an aspect of the present invention.

FIG. 2 is a block diagram of a system 200 employing an antenna system 218 having an antenna 202 and associated electronics 204 coupled via a conductor 216 in accordance with an aspect of the present invention. Sensor 210 receives wireless signal 208 from antenna 202 and sends data about the signal via optic coupler 212 is to antenna electronics 204. Transmitter 206 employs a bidirectional interface 214 for obtaining the data and/or other characteristics about antenna 202 stored in antenna electronics 204 as well as for conduction of the wireless signal from the transmitter 206 through the antenna electronics 204 to the antenna 202.

In a preferred embodiment, antenna electronics 204 comprises an electronic serialization component for indicating the measured conductivity, power level and/or one or more predetermined antenna characteristics. The electronic serialization component can be any suitable type of identification circuit, where the predetermined antenna characteristics are coded into or by the circuit. The predetermined antenna characteristics can be any suitable type of information that can be used to identify the antenna or its properties. For example, the characteristics can include the level of antenna gain and its associated maximum output power, desired operation of the antenna, including selecting a preferred operational frequency band. The characterizing can also include a product model identification number, including the manufacturer and the specific radio components and type of connection with which the antenna 102 is permitted to operate, in accordance with worldwide regulatory requirements. Any other suitable identification characteristics could also be employed, without departing from the invention. An advantage of this embodiment is that because sensor 210 and optical coupler 212 are connected to antenna electronics 204, the need for additional conductors between transmitter 206 and antenna system 218 is obviated.

In a preferred embodiment, the electronic serialization component is a programmable circuit, such as a semiconductor controller and memory chip. For example, a Dallas Semiconductor DS2502P memory chip, available from Dallas Semiconductor Corp., 4401 South Beltwood Parkway, Dallas, Tex. 75244 USA is suitably adapted for use with the present invention, though any other equivalent or suitable component(s) could be used.

In a preferred embodiment, the antenna electronics 204 is an integral part of an antenna system that can be connected to the transmitter 206, so as to provide an externally-mounted antenna system 218. Antenna system 218 can also be internally-mounted into a housing, so as to be a part of an internal unit. Antenna electronics 204 are mounted "downstream" of the antenna element 202. The bidirectional interface 214 can be any suitable conductor such as a coaxial cable, or any other suitable means for establishing a signal connection with transmitter 206.

In operation, antenna electronics 204 employs a serialization component that is configured to "read out" the programmed antenna characteristics, so as to send an "identification stream" through bidirectional interface 214 to transmitter 206. Transmitter 206 includes an algorithm and suitable hardware for receiving and processing the signal from the serialization component of antenna electronics 204, and may be responsive to vary one or more operational parameters in response to antenna characteristics obtained. For example, if the transmit power measured by sensor 210 exceeds a predetermined level, e.g., FCC maximum level, transmitter 206 is suitably adapted to adjust the power of the signal sent to antenna system 218 as to maintain compliance with the FCC-standards. In this way, a WLAN can now be installed without significant "fine-tuning" of maximum output power by professional installers. By enabling antenna power to be automatically detected by sensor 210, the present system could feasibly be installed by average maintenance personnel. It is hoped that the present invention would simplify rollout of a WLAN, and possibly lead to the revision of the FCC installation requirements. Alternatively, the present invention also enables the power of signal 208 to be the maximum power allowed by compensating for losses, such as power loss over bidirectional interface 214 or conductor 216. If the power measured by sensor 210 for signal 208 from antenna 202 is less than the maximum allowed power, transmitter 206 raises its output power level until reaching the maximum allowed power.

In another embodiment of the present invention, antenna electronics 204 for use with antenna system 218 includes a microcontroller (not shown) for data to transmitter 206. Transmitter 206 receives data about the transmission characteristics of signal 208 and selectively controls its power output. Thus, transmitter 206 will transmit a suitable amount of power so as to establish a desired coverage area and/or comply with radiant power regulations.

For example, in a preferred embodiment, a Microchip PIC12F629, available from Microchip Technology Inc., 2355 West Chandler Blvd., Chandler, Ariz., USA 85224-6199, is used as microcontroller by antenna electronics 204. The PIC12F629 is a readily available off-the-shelf microcontroller having 6 general purpose input/output (GPIO) ports, a universal asynchronous receiver/transmitter (UART), 128 bytes of electrically erasable programmable read-only memory (EEPROM), program memory, and random access memory (RAM). Thus, the PIC12F629 provides the hardware required for identification, e.g., transmission characteristics, and communications functions. Furthermore, with additional electronics added to convert optical signals to electrical signals, the PIC12F629 is adaptable to receive signals from sensor 210 via optical coupler 212.

In operation, the microcontroller within antenna electronics 204 sends "transmission characteristics" representative of a desired property or parameter of the respective antenna system 218 via bidirectional interface 214 to transmitter 206 so as to allow the transmitter to determine when to vary the power output level. Other transmission characteristics that can be sent from antenna properties and parameters include, but are not limited to, a predetermined antenna gain, or an identifying characteristic of the respective antenna assembly, such as a product model number. For example, the properties and parameters can include antenna information such as antenna type (e.g., dipole, omni, patch, etc.), gain, serial number, part number, date of manufacturer, continuity, measured output power, etc. Antenna electronics 204 can include an electronic memory element for reading out preprogrammed antenna characteristics to transmitter 206.

Figure 3:
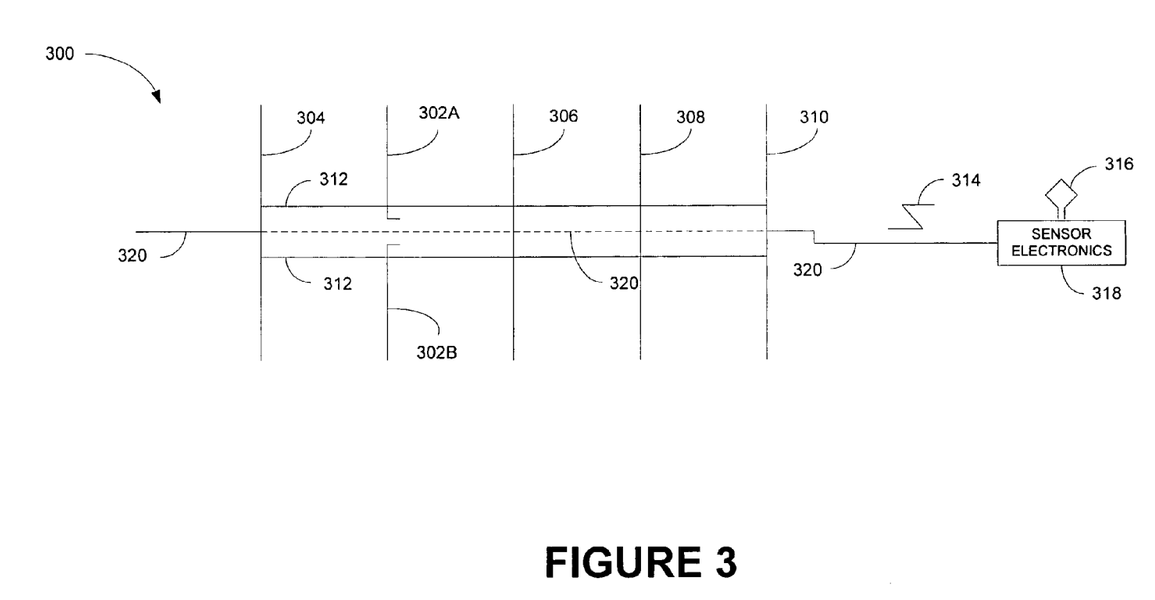
FIG. 3 is an isometric diagram of a Yagi-Uda antenna configured in accordance with an aspect of the present invention.

FIG. 3 is an isometric diagram of a Yagi-Uda antenna 300 configured in accordance with an aspect of the present invention. The antenna has a mast or mounting structure 312 for mechanically holding the radiating elements 302A 302B, reflector 304 and directors 306, 308, 310. In operation, a signal to be transmitted is sent via conventional conductive means to radiating elements 302A and 302B, reflected by reflectors 304 and directed by directors 306, 308, 310. A sample of the signal 314 is received by sensor antenna 316 and processed by sensor electronics 318. An optical coupler 320 is used to send data back to the transmitter or other electronics associated with the antenna. In one preferred embodiment, the sensor electronics 318 parasitically derives power from signal 314, an example illustrating how this can be accomplished is illustrated herein infra. In another preferred embodiment, power is sent to sensor electronic 318 optically via optical coupler 320. Although as shown sensor sampling antenna 316 is located away from antenna 300, those skilled in the art can readily appreciate that sensor antenna 316 can be placed anywhere. For example, sensor antenna 316 can be placed near director 306 to determine the continuity of director 316, or sensor antenna 316 can be placed near one of radiating elements 302A, 302B to verify their continuity or to measure signal power level.

Figure 4:
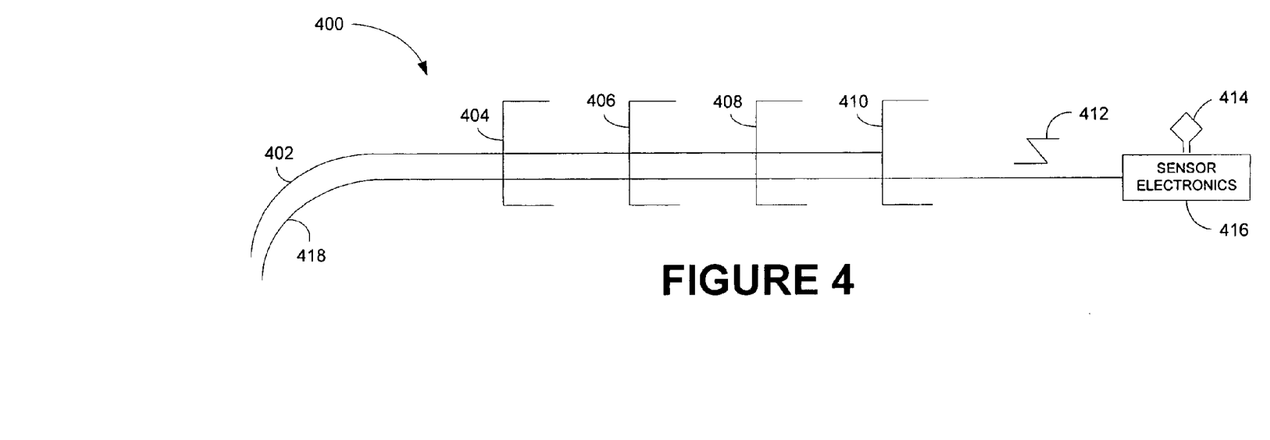
FIG. 4 is an isometric diagram of a collinear array configured in accordance with an aspect of the present invention.

FIG. 4 is an isometric diagram of a collinear array 400 configured in accordance with an aspect of the present invention. Collinear array 400 comprises array elements 404, 406, 408, 410 that receive a signal from feed 402. A wireless signal 412 is radiated from antenna 400 and is received by sensor sampling antenna 414 and processed by sensor electronics 416. An optical coupler 418 is used to send data about signal 412 back to the transmitter or other electronics associated with antenna 400. In one preferred embodiment, the sensor electronics 416 parasitically derives power from signal 412, an example of how this is accomplished illustrated herein infra. In another preferred embodiment, power is sent to sensor electronic 416 optically via optical coupler 418. Although as shown sensor antenna 414 is located away from antenna 400, those skilled in the art can readily appreciate that sensor antenna 418 can be placed anywhere. For example, sensor antenna 414 can be placed near either of array elements 404, 406, 408, 410 to verify their continuity or to measure signal power level.

Figure 5:
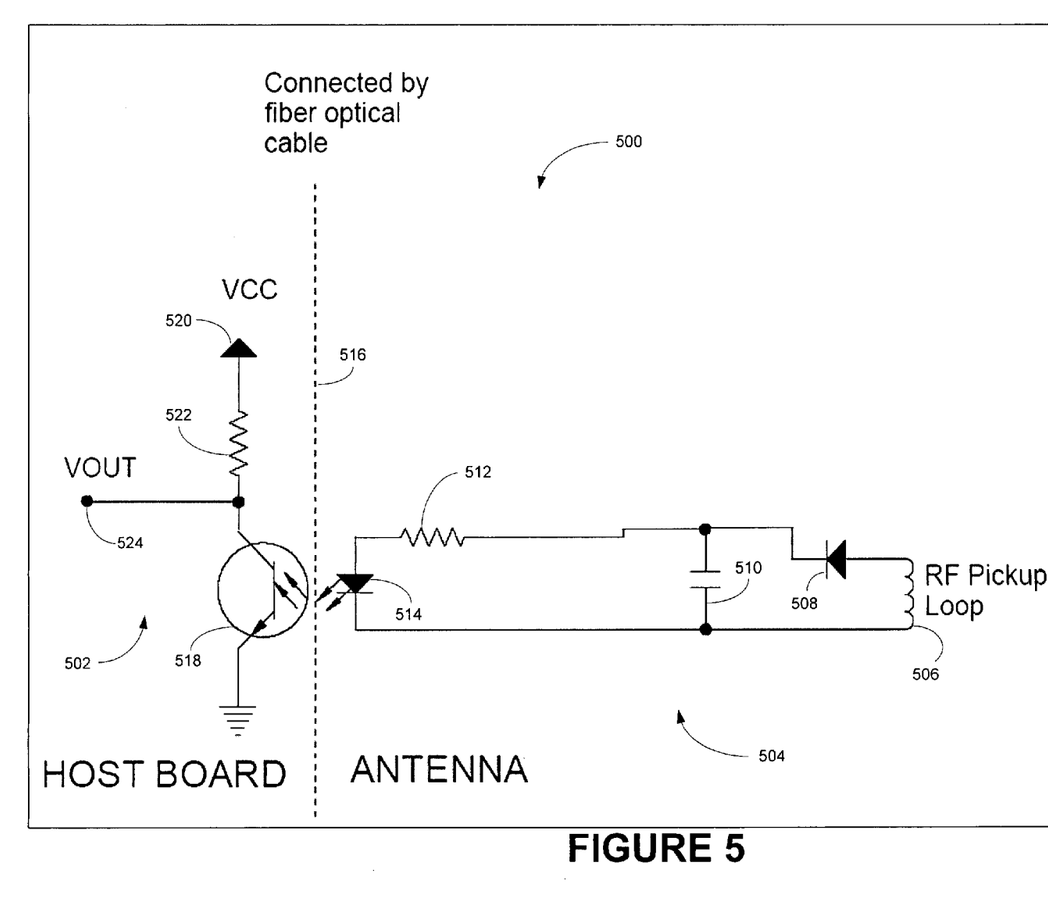
FIG. 5 is a circuit diagram of a passive sensing system in accordance with an aspect of the present invention.

FIG. 5 is a circuit diagram of a passive sensing system 500 in accordance with an aspect of the present invention. Passive sensing system 500 comprises a host board section 502 and an antenna section 504. The host board section 502 is typically located with the transmitter (e.g. transmitter 104—FIG. 1) or about the antenna (e.g. antenna electronics 106—FIG. 2). The antenna section 504 is the section used for performing the actual measurements from the antenna, or array element being monitored.

RF Pickup Loop 506 receives a wireless signal, e.g., an RF signal, from a transmission source, e.g., antenna 102 (FIG. 1) or antenna 202 (FIG. 2), antenna 300 (FIG. 3) or antenna 400 (FIG. 4). The signal is then rectified by diode 508 and stored in capacitor 510. Diode 508, capacitor 510, and resistor 512 should be recognized as a simple envelope detector. When a sufficient voltage is reached across capacitor 510 to forward bias the light emitting diode 514, a current flows through resistor 512 and light emitting diode 514. Light from light emitting diode 514 is transmitted along optic coupler 516, e.g., a fiber optic cable to optical transistor 518. Optical transistor 518 receives power from VCC 520 through resistor 522. An output voltage, VOUT 524 results from optical transistor 518 switching in response to optical signal received from light emitting diode 514 via optical coupler 516.

In this embodiment, the host board 502 is powered via VCC 520. However, power for the antenna section 504 is parasitically derived from RF Pickup Loop 506, which for example can be a small copper loop. It should become obvious that this parasitic operation requires enough power, derived parasitically from the RF energy, to drive the light emitting diode 514 into a state detectable by the optical transistor 518. Because antenna section 504 does not require power, in accordance with an aspect of the present invention it can be very compact in size. Furthermore, in accordance with an aspect of the present invention, because the signals are sent optically from antenna section 504 to host board section 502, the present invention does not disturb the radiating pattern (e.g., VSWR, impedance, etc.) of the antenna. In accordance with another aspect of the present invention, the host board 502 can be located near a feed for the antenna being monitored (for example as shown in FIG. 2), thus obviating the need for additional wires between the antenna and the transmitter.

Figure 6:
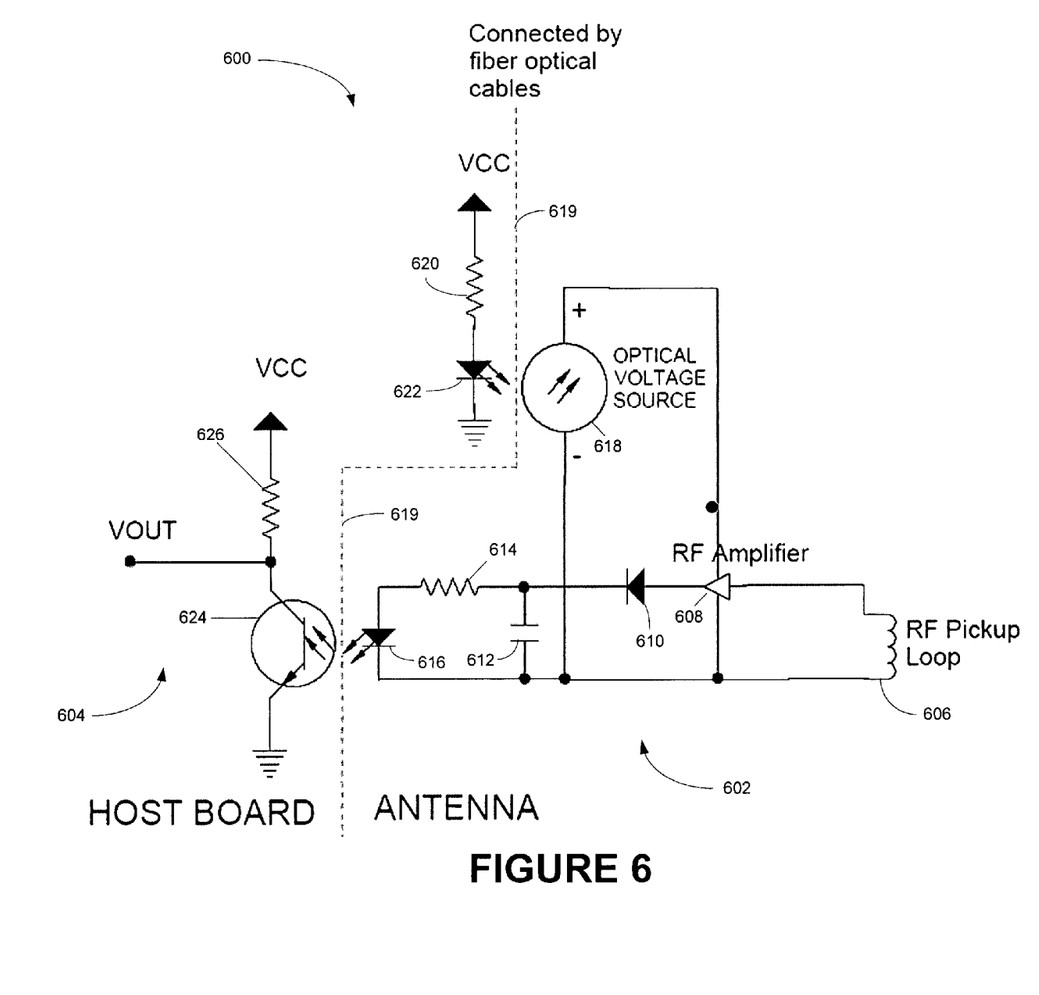
FIG. 6 is a circuit diagram of an active sensing system in accordance with an aspect of the present invention.

FIG. 6 is a circuit diagram of an active sensing system 600 in accordance with an aspect of the present invention. The active sensing system 600 has an antenna section 602 for sensing the wireless signal from the antenna being monitored and a host board section 604 for receiving data from antenna section 602.

Host board section comprises a source voltage VCC that is connected to a light emitting diode 622 through resistor 620. Current flowing through light emitting diode 622 causes an optical (light) signal to be generated that is transmitted via optical conductor 619 (e.g., a fiber optic cable) to an optical voltage source 618 on antenna section 602. Optical voltage source is suitably one of any device, such as are well known in the art, for converting optical (light) energy to electrical energy. The electrical energy from optical voltage source 618 is used to provide power to RF amplifier 608. RF Pickup Loop 606 receives electrical energy from wireless signals being generated by the antenna being monitored. The energy received by RF Pickup Loop 606 is converted to an electrical signal that is amplified by RF amplifier 608, rectified by rectifier 610 and stored by capacitor 612. Diode 610, capacitor 612, and resistor 614 should be recognized as a simple envelope detector. When the voltage across capacitor 612 reaches a level sufficient to forward bias the light emitting diode 616, an electrical current flows through resistor 614 and light emitting diode 616. Light emitting diode 616 converts the electrical energy to light energy that is transmitted via optic coupler 619 to optical transistor 624. It should be obvious that the amplifier is used to amplify a signal that would otherwise not be able to forward bias the diode 616 sufficiently to, in turn, be detected by the optical transistor 624. Optical transistor 624 is coupled to a voltage source VCC via resistor 626 and produces an output voltage VOUT based on the optical signals received from light emitting diode 616. Thus, batteries and/or external electrical power sources are not required.

In a preferred embodiment, the light from light emitting diode 622 transmitted on optical coupler 619 is using a different frequency than that of the light from light emitting diode 616 while both use the same optical coupler. This allows power and data to be sent on the same optical coupler at the same time. In another preferred embodiment, optical coupler 619 comprises two optical couplers, e.g., two fiber optic cables, where one cable is used to transmit power from light emitting diode 622 to optical voltage source 618 and the second cable is used to send data from light emitting diode 616 to optical transistor 624.

Figure 7:
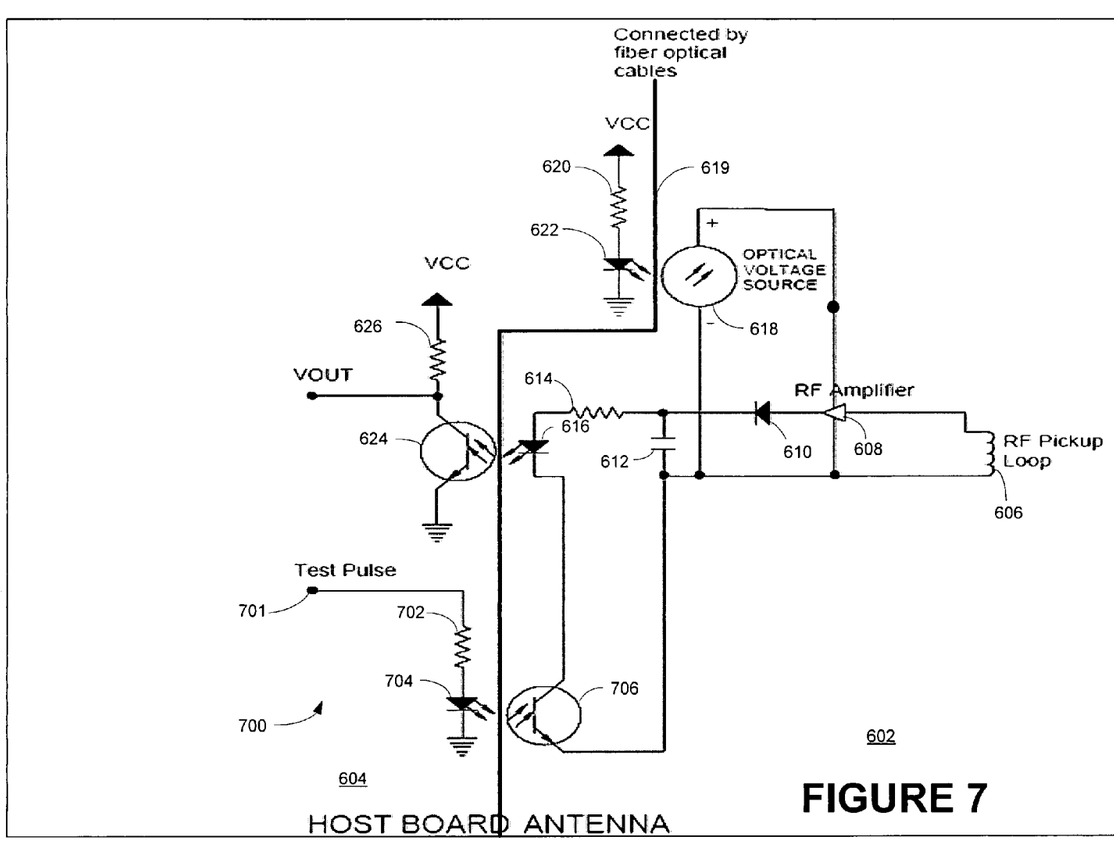
FIG. 7 is a circuit diagram of an active sensing circuit with a test circuit in accordance with an aspect of the present invention.

FIG. 7 is a circuit diagram of an active sensing circuit 700 with a circuit in accordance with an aspect of the present invention. Once the envelope detector made up of diode 610, capacitor 612 and resistor 614 has had sufficient time to charge capacitor 612 to a voltage high enough to forward bias the light emitting diode 616, a test pulse is generated at 701. This Test Pulse is received at input 701 on host board section 604 causing a current to flow through resistor 702 and light emitting diode 704. Light from light emitting diode 704 is conducted via optical coupler 619 to optical transistor 706 at the antenna section 602. This causes the charge stored in the capacitor 612 to discharge through the resistor 616, thus forward biasing the light emitting diode 616. Diode 616 then generates a pulse that is sent via light emitting diode 616 to optical transistor 624, which can be measured at VOUT. It should be obvious that the amplifier is used to amplify a signal that would otherwise not be able to charge the capacitor 612 to a voltage sufficient to forward bias the diode 616 to, in turn, be detected by the optical transistor 624. This embodiment permits the sensor to test continuity of the antenna remotely from the host board 604. For example, when no signals are received from antenna section 602 it may be indicative of a malfunction of the antenna, such as continuity being lost. However, it can also mean a malfunction of antenna section 602. By applying a test pulse, the circuitry of antenna section 602 can be confirmed to be working properly. Because the test pulse is sent optically from antenna section 602 to sensing circuit 604, the present invention does not disturb the radiating pattern (e.g., VSWR, impedance, etc.) of the antenna.

Figure 8:
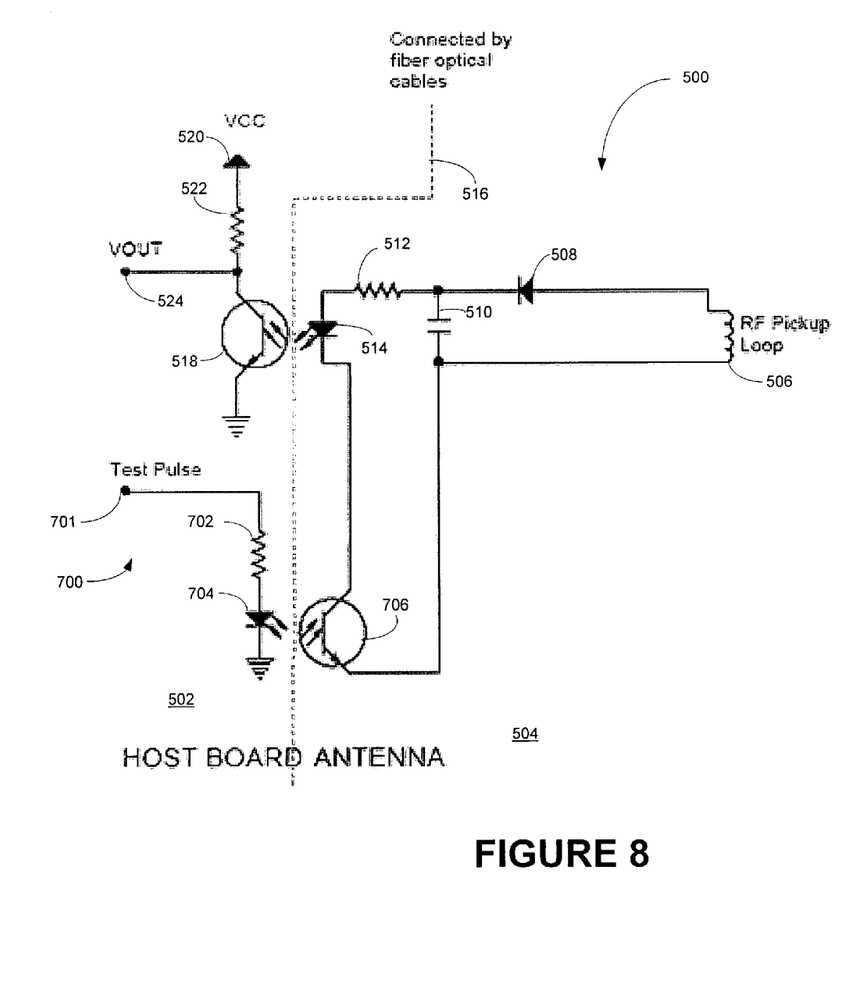
FIG. 8 is a circuit diagram of a passive sensing circuit with a test circuit in accordance with an aspect of the present invention.

FIG. 8 is a circuit diagram of a passive sensing circuit 500 with a test circuit in accordance with an aspect of the present invention. It should become obvious that this parasitic operation of RF Pickup Loop 506 requires enough power to drive the light emitting diode 514 into a state detectable by the optical transistor 518. Once the envelope detector made up of diode 508, capacitor 510 and resistor 512 has had sufficient time to charge capacitor 510 to a voltage high enough to forward bias the light emitting diode 514, a test pulse is generated at 701. This Test Pulse is received at input 701 and causes a current to flow through resistor 702 and light emitting diode 704, which generates light energy that is transmitted across optical coupler 516. Optical transistor 706 receives the light from light emitting diode 704 and converts it to electrical energy causing a current to flow in the circuit of antenna section 504, which, if the circuit is operating properly, will cause light to be emitted by light emitting diode 514 which can be detected by optical transistor 518 and measured at VOUT 524. As with the embodiment illustrated in FIG. 7, the test circuitry does not disturb the radiating pattern (e.g., VSWR, impedance, etc.) of the antenna while enabling antenna section 504 to test continuity of the antenna remotely from the host board 502.

Figure 9:
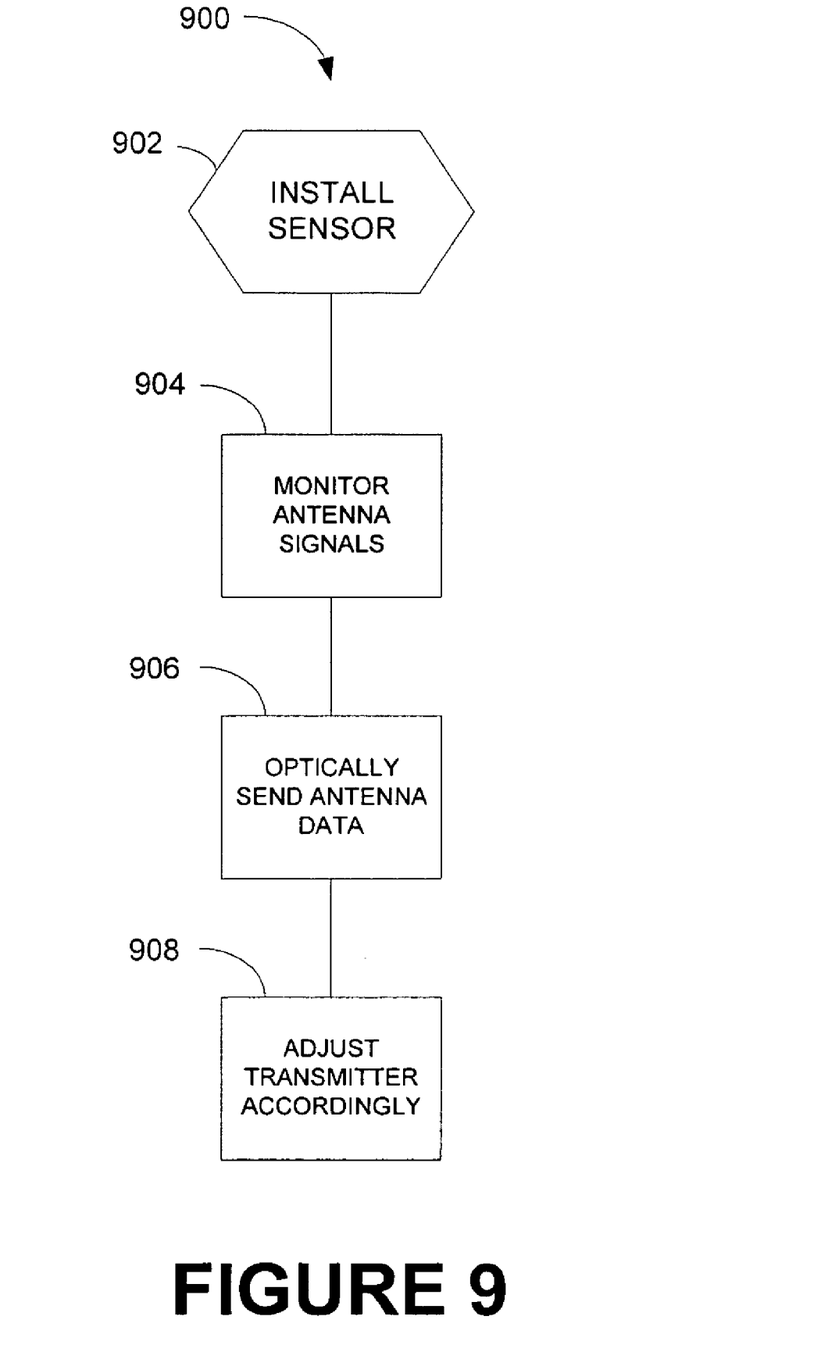
FIG. 9 is a block diagram of a methodology in accordance with an aspect of the present invention.

In view of the foregoing structural and functional features described above, a methodology in accordance with various aspects of the present invention will be better appreciated with reference to FIG. 9. While, for purposes of simplicity of explanation, the methodology of FIG. 9 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 9 is a block diagram of a methodology 900 in accordance with an aspect of the present invention. At step 902 the sensor is installed. The sensor may be installed either at the antenna (or at an element of an antenna to be monitored) or upstream thereof.

At 904 antenna signals (or signals from an element, such as an array element) are monitored. The signals are monitored by sampling RF energy from the antenna. The monitoring may comprise determining whether the antenna (or element) has continuity and/or measuring a power level of the signals.

At 906 data from the monitored signals are sent optically. The data may be sent to a transmitter, or to electronics associated with the antenna. Optical signals are generated based on the sampled RF energy from the antenna. The optical signals are then sent via an optical coupler and communicating the optical signal to a transmitter coupled to the antenna.

In the case of an antenna with associated electronics, the optical signal is sent to the associated electronics. Then the transmitter receives the data from the associated electronics.

At 908, the transmitter is adjusted in response to the monitored signals. For example, the transmitter can be adjusted to generate more power to compensate for power loss within the transmitter, antenna, and/or cabling coupling the transmitter to the antenna. Alternatively, if the signals exceed a desired power threshold (for example an FCC maximum power specification), the transmitter can reduce its power level.

In a preferred embodiment, step 906 further comprises generating optical signals by rectifying the RF energy received by the sensor and modulating the rectified signal with a light emitting diode, thereby converting the RF energy to light energy. The optical signals are communicated by detecting the light energy and converting the detected light energy to an electrical signal.

In a preferred embodiment, the sensor parasitically receives power from the wireless signal being monitored. In an alternative preferred embodiment, power is sent optically to the sensor. In alternative embodiments, power may be obtained from any mechanism that does not impede the objective of leaving the radiation characteristics of the antenna undisturbed. Example power sources include batteries, solar cells, energy storage capacitors, or the like.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims interpreted in accordance with the breadth to which they are fairly, legally and equitably entitled.

The invention claimed is:

1. A method for monitoring an antenna with an isolated sensor, comprising:
   receiving RF energy from the antenna;
   generating data based on the received RF energy from the antenna; and
   optically communicating the data to a transmitter coupled to the antenna;
   wherein the power for the isolated sensor is obtained by one of a group consisting of passively from the received RF energy and optically from an optical coupler.

2. A method according to claim 1, further comprising
   the generating an optical signal further comprising
      rectifying the RF energy, and
      modulating a light emitting diode, thereby converting the RF energy to light energy; and
   the communicating an optical signal further comprising
      detecting the light energy, and
      converting the detected light energy to an electrical signal.

3. A method according to claim 1, further comprising:
   transmitting power to the sensor wirelessly from the transmitter.

4. A method according to claim 3, the transmitting power further comprising sending power optically to the sensor.

5. A system, comprising:
   an adjustable transmit power source;
   an antenna coupled to the adjustable power source;
   a sensor adapted for receiving wireless signals from the antenna, the sensor comprising a copper loop for receiving wireless signals from the antenna; and
   an optical coupler for providing data from the sensor to the adjustable transmit source;
   wherein power for the sensor is obtained passively from the wireless signals from the antenna.

6. A system according to claim 5, further comprising:
   a circuit communicatively coupled to the antenna for storing data about the antenna;
   a bidirectional communication interface coupling the circuit to the adjustable transmit power source;
   wherein the optical coupler is coupled to the circuit and provides the data from the sensor to the circuit; and
   wherein the adjustable transmit power source obtains the data from sensor via the bidirectional interface from the circuit.

7. A system according to claim 6, the circuit further comprising:
   a microcontroller; and
   a memory for storing the data and antenna parameters.

8. A system according to claim 6, wherein the adjustable transmit power source adjusts the transmit power based on the data received via the bidirectional interface from the circuit.

9. A system according to claim 5, the sensor further comprising:
   a capacitor connected in parallel with the copper loop for storing energy received from the copper loop;
   a diode coupled between the capacitor and copper loop; and
   a light emitting diode coupled in parallel with the capacitor;
   wherein the light emitting diode provides optical energy to the optical coupler.

10. A system according to claim 5, wherein the optical coupler comprises a fiber optic cable.

11. A system according to claim 5, the adjustable transmit power source further comprising a microprocessor configured to adjust the transmit power of the adjustable transmit power source based on the data received from the sensor.

12. A system, comprising:
    an adjustable transmit power source;
    an antenna coupled to the adjustable power source;
    a sensor adapted for receiving wireless signals from the antenna; and
    an optical coupler for providing data from the sensor to the adjustable transmit source;
    wherein the sensor receives power optically via the optical coupler.

13. A system according to claim 12, further comprising:
    a circuit communicatively coupled to the antenna for storing data about the antenna;
    a bidirectional communication interface coupling the circuit to the adjustable transmit power source
    wherein the optical coupler is coupled to the circuit and provides the data from the sensor to the circuit; and
    wherein the adjustable transmit power source obtains the data from sensor via the bidirectional interface from the circuit.

14. A system according to claim 13, the circuit further comprising:
    a microcontroller; and
    a memory for storing the data and antenna parameters.

15. A system according to claim 13, wherein the adjustable transmit power source adjusts the transmit power based on the data received via the bidirectional interface from the circuit.

16. A system according to claim 12, the sensor further comprising:
    a copper loop for receiving wireless signals from the antenna; and wherein power for the sensor is obtained passively from the wireless signals from the antenna.

17. A system according to claim 16, the sensor further comprising:
- a capacitor connected in parallel with the copper loop for storing energy received from the copper loop;
- a diode coupled between the capacitor and copper loop; and
- a light emitting diode coupled in parallel with the capacitor;
- wherein the light emitting diode provides optical energy to the optical coupler.

18. A system according to claim 12, wherein the optical coupler comprises a fiber optic cable.

19. A system according to claim 12, wherein data is sent from the sensor via the optical coupler using a first frequency, and power is sent from the adjustable transmit power source via the optical coupler using a second frequency.

20. A system according to claim 12, the optical coupler further comprising:
- a first optical link for sending data from the sensor; and
- a second optical link for sending power from the adjustable transmit power source;
- wherein power for the sensor is received via the second optical link.

21. A system according to claim 12, further comprising:
- the adjustable transmit power source further comprising a light emitting diode optically coupled to the optical coupler;
- the sensor further comprising an optical transistor coupled to the optical coupler;
- wherein power from the adjustable transmit power source is transmitted by the light emitting diode to the optical transistor.

22. A system according to claim 12, the adjustable transmit power source further comprising a microprocessor configured to adjust the transmit power of the adjustable transmit power source based on the data received from the sensor.

* * * * *